US010338623B2

United States Patent
De Natale et al.

(10) Patent No.: US 10,338,623 B2
(45) Date of Patent: Jul. 2, 2019

(54) POWER AND CONTROL DEVICE FOR MEDIUM VOLTAGE APPLICATIONS

(71) Applicant: ABB Technology AG, Zurich (CH)

(72) Inventors: Gabriele Valentino De Natale, Milan (IT); Luciano Di Maio, Milan (IT); Marco Testa, Dalmine (IT)

(73) Assignee: ABB SCHWEIZ AG, Baden (CH)

( * ) Notice: Subject to any disclaimer, the term of this patent is extended or adjusted under 35 U.S.C. 154(b) by 391 days.

(21) Appl. No.: 14/988,987

(22) Filed: Jan. 6, 2016

(65) Prior Publication Data

US 2016/0202716 A1 Jul. 14, 2016

(30) Foreign Application Priority Data

Jan. 9, 2015 (EP) .................................. 15150594

(51) Int. Cl.
| | |
|---|---|
| *G05B 15/02* | (2006.01) |
| *G05F 1/625* | (2006.01) |
| *G05F 1/66* | (2006.01) |
| *G01R 33/00* | (2006.01) |
| *H02H 5/04* | (2006.01) |
| *H02H 7/20* | (2006.01) |

(Continued)

(52) U.S. Cl.
CPC ........... *G05F 1/66* (2013.01); *G01R 33/0082* (2013.01); *G05B 15/02* (2013.01); *G05F 1/625* (2013.01); *H02H 5/047* (2013.01); *H02H 7/205* (2013.01); *H02H 11/00* (2013.01); *H05B 1/023* (2013.01); *H01H 9/54* (2013.01); *H01H 33/59* (2013.01)

(58) Field of Classification Search
CPC ..... G01R 33/0082; G05B 15/02; G05F 1/625; G05F 1/66; H01H 33/59; H01H 9/54; H02H 11/00; H02H 5/047; H02H 7/205; H05B 1/023
See application file for complete search history.

(56) References Cited

U.S. PATENT DOCUMENTS

| 5,896,259 A | 4/1999 | Farwell et al. |
| 6,423,940 B1 * | 7/2002 | Schupbach ........ G05D 23/1919 |
| | | 219/209 |

(Continued)

FOREIGN PATENT DOCUMENTS

| CN | 101106264 A | 1/2008 |
| EP | 2693851 A1 | 2/2014 |

OTHER PUBLICATIONS

Extended European Search Report dated Jul. 22, 2015 in EP Application No. 15150594.8.

(Continued)

*Primary Examiner* — Abdelmoniem I Elamin
(74) *Attorney, Agent, or Firm* — Polsinelli PC

(57) ABSTRACT

A power and control device (1) for medium voltage applications characterized in that it comprises a power and control unit (2) having a first feeding port (21) electrically coupleable with electric power supply means (60), a first control device (3) operatively coupled to said first feeding port, said first control device being adapted to prevent the electrical feeding of said power and control unit through said first feeding port, when the operating temperature of said power and control device is lower than a first threshold value (TH1) indicative of a minimum operating temperature provided for said power and control unit.

14 Claims, 7 Drawing Sheets

(51) Int. Cl.
*H02H 11/00* (2006.01)
*H05B 1/02* (2006.01)
*H01H 9/54* (2006.01)
*H01H 33/59* (2006.01)

(56) References Cited

U.S. PATENT DOCUMENTS

| | | | | |
|---|---|---|---|---|
| 8,212,184 | B2* | 7/2012 | Mowry | H01L 23/34 |
| | | | | 219/209 |
| 8,704,630 | B2* | 4/2014 | Melvin, Jr. | G05B 9/02 |
| | | | | 219/201 |
| 8,981,259 | B2* | 3/2015 | Chou | H05B 1/02 |
| | | | | 219/209 |
| 9,012,811 | B2* | 4/2015 | White | H05B 3/28 |
| | | | | 219/209 |
| 9,165,853 | B2* | 10/2015 | Wang | H05B 1/0227 |
| 2008/0013241 | A1* | 1/2008 | Wong | H02H 5/083 |
| | | | | 361/114 |
| 2012/0050000 | A1 | 3/2012 | Melvin, Jr. et al. | |
| 2012/0134708 | A1* | 5/2012 | Asaka | G03G 21/203 |
| | | | | 399/97 |
| 2012/0229937 | A1 | 9/2012 | Ramamurthy et al. | |
| 2014/0027435 | A1* | 1/2014 | Chou | H05B 1/02 |
| | | | | 219/209 |
| 2017/0156111 | A1* | 6/2017 | Law | H04W 52/027 |

OTHER PUBLICATIONS

Chinese Office Action dated Sep. 5, 2018 in the corresponding counterpart patent application No. 201610011763.5.

* cited by examiner

POWER AND CONTROL DEVICE FOR MEDIUM VOLTAGE APPLICATIONS

CROSS REFERENCE TO RELATED APPLICATIONS

This application claims priority to Application No. 15150594.8 filed in Europe on Jan. 9, 2015 under 35 U.S.C. § 119, the entire contents of which are hereby incorporated by reference.

TECHNICAL FIELD

The present invention relates to a power and control (P&C) device for medium voltage electric applications.

For the purposes of the present invention, the term medium voltage (MV) identifies voltages higher than 1 kV AC and 1.5 kV DC up to tens of kV, e.g. up to 72 kV AC and 100 kV DC. The P&C device of the invention is particularly suitable for use in a MV switching apparatus, such as a recloser, a circuit breaker, a contactor, a disconnector, or the like.

BACKGROUND ART

As is known, electronic devices for power and control purposes are conveniently used in MV apparatuses (e.g. reclosers, circuit breakers, contactors, disconnectors) to operate the loiters. As an example, a MV switching apparatus typically comprises an electronic P&C device for driving the actuator of the switching apparatus and providing control functions for properly managing the operation of the actuator, protection functions against possible overcurrents circulating in the actuator and/or diagnostic functions to check the functionalities of the actuator and/or the internal circuits.

As is known, some MV applications (typically in certain outdoor installations) operate in critical environmental conditions and may be subject to very low temperatures, even lower than −40° C.

As commonly available industrial electronic equipment is typically designed for operating at temperatures higher than the rated minimum operating temperature of −40° C., a P&C device for use in these MV applications is generally provided with or operatively associated to an electric heater that is powered to maintain the operating temperature of higher values. Traditional P&C devices of the type described above have some drawbacks.

In currently available solutions, when the electric power supply is interrupted for some reasons (e.g. due to a fault), the electric and electronic equipment of the P&C device (including the electric heater) is switched-off.

The internal temperature of the P&C device may thus drop to values lower than the rated minimum operating temperature.

Thus, as the power supply is restored, the electronic equipment of the P&C device may start operating at temperatures out of the nominal operating range for which it was designed (cold start).

These circumstances may easily give raise to faults and/or determine improper operations of the P&C device.

On the other hand, some traditional P&C devices are not provided with means to automatically switch-off the electric heater, when the internal temperature increases above a given threshold value.

Some electronic equipment of the P&C device may thus be subject to over-heating phenomena when the environmental temperature rises for some reasons. This may cause faults or a remarkable reduction of the useful life.

In other cases, a thermostat is provided to automatically switch-off the electric heater.

This solution does not ensure satisfactory performances in terms of reliability.

In fact, commonly available industrial thermostats are sometimes subject to configuration errors or faults that may jeopardize the quality of their performances.

A possible solution to overcome most of the drawbacks described above would be to use military electronic equipment for the realization of the power and control device.

As is known, electronic equipment of this type ensures outstanding and reliable performances and is generally rated for a minimum operating temperature of −55° C. or lower.

Unfortunately, this solution entails high industrial costs for the realization of the P&C devices.

SUMMARY OF DISCLOSURE

It is an object of the present invention to provide a power and control device for MV applications that solves the above-mentioned problems.

More in particular, it is an object of the present invention to provide a power and control device capable of ensuring reliable and improved performances even when operating at very low temperatures (e.g. at temperatures around −40° C. or lower).

Still another object of the present invention is to provide a power and control device for medium voltage applications that can be easily manufactured and at competitive costs.

The present invention provides a power and control device for medium voltage applications according to the following claim 1 and the related dependent claims.

Further characteristics and advantages of the invention will emerge from the description of preferred, but not exclusive, embodiments of the power and control unit for medium voltage applications according to the invention, non-limiting examples of which are provided in the attached drawings, wherein FIGS. 1-7 are block schemes of some embodiments of the power and control device, according to invention.

BEST AND VARIOUS MODES FOR CARRYING OUT DISCLOSURE

Figure 1:
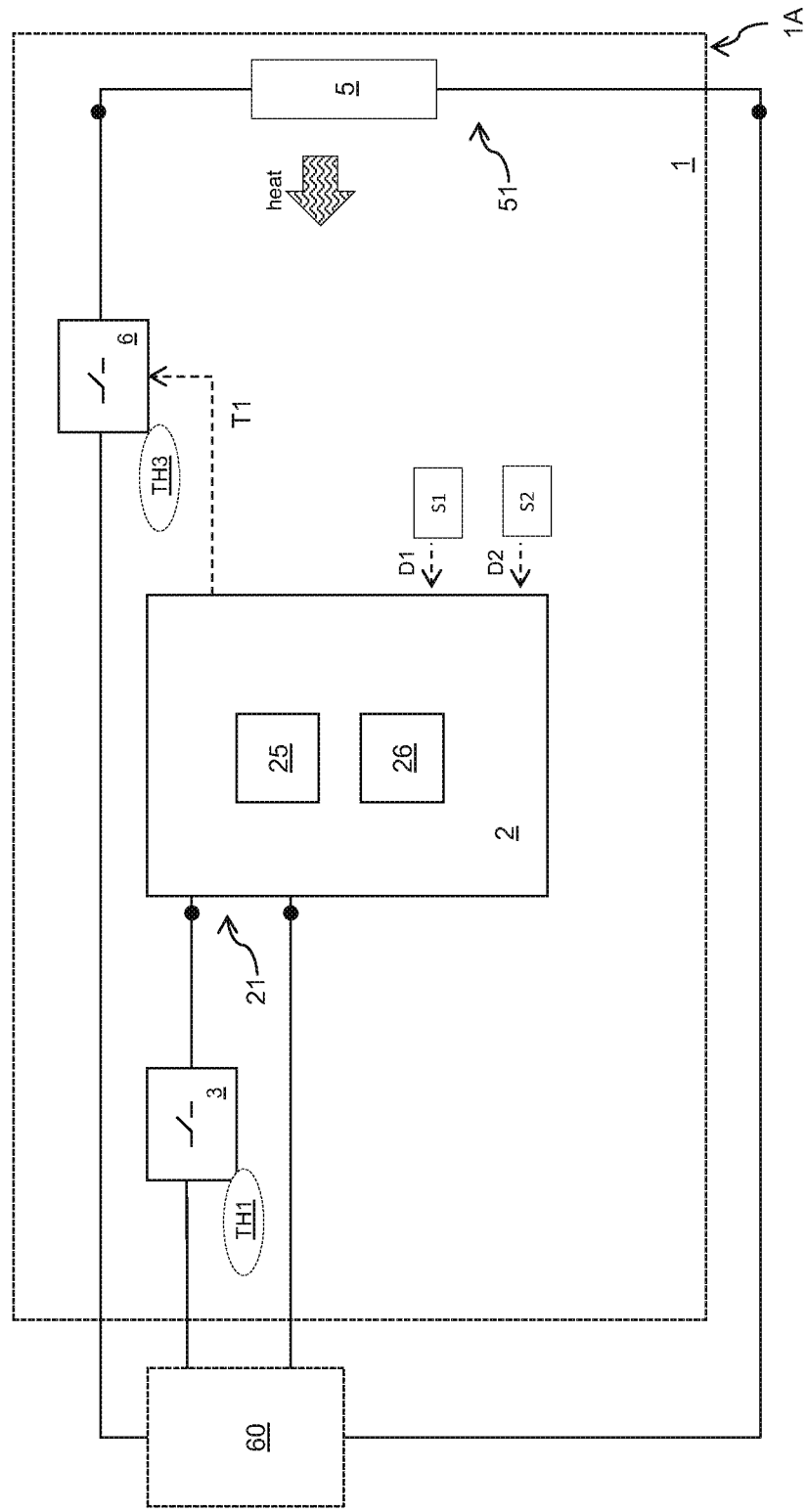
FIG. 1 is a block schematic diagram of an embodiment of the power and control device, according to present invention.

Referring to the cited figures, the present invention relates to a power and control device 1 for MV applications.

The power and control (P&C) device 1 comprises an enclosure 1A that defines an internal volume in which its components are accommodated.

As an example, in a MV switching device, the enclosure 1A may be the enclosure of the low voltage cabinet of the switching device.

The P&C device 1 comprises a power and control (P&C) unit 2.

The P&C unit 2 comprises control means 25 that include one or more computerized units, such as microprocessors or other digital signal processing devices.

The P&C unit 2 (namely the control means 25) is configured to execute software instructions to generate control/data signals for managing operation of internal components/devices of the P&C device 1 and of external equipment operatively associated to said P&C device.

The P&C unit 2 may be advantageously configured to provide control functions, protection functions and/or diagnostics functions for properly managing the operating life of the P&C device 1 and/or of external equipment.

The P&C unit 2 may be advantageously configured to provide driving functions of electromagnetic, electric and/or electronic equipment.

To this aim, the P&C unit 2 may comprise one or more driving circuits 26 by means of which it may provide electric power to the driven equipment.

As an example, in a MV switching device of the electromagnetic type, the driving circuits 26 may be configured to provide suitable excitation currents to the electromagnetic actuator of the switching device.

The operation of the driving circuits 26 are advantageously controlled by the control means 25.

The P&C unit 2 is preferably realized with industrial-standard electronic components.

The P&C unit 2 is configured to receive electric power from power supply means 60, which may be of known type.

In general, the power supply means 60 may comprise one or more power supply units configured to feed the devices of the MV application in which the P&C device 1 is installed.

As an example, in a MV switching device, the power supply means 60 may comprise a power supply unit (auxiliary power supply) capable of deriving electric power from the main AC power line in which the switching device is installed and capable of providing a plurality of different power supplies at different voltages.

The P&C unit 2 is provided with a first feeding port 21 electrically coupleable with the electric power supply means 60.

According to the invention, the P&C device 1 comprises a first control device 3, which in operation (i.e. when the P&C device 1 is installed) is electrically connected with the first feeding port 21 of the P&C unit 2 and with the power supply means 60.

The control device 3 is adapted to electrically couple/decouple the feeding port 21 to/from the power supply means 60 as a function of the operating temperature of the P&C device 1.

More particularly, the control device 3 is adapted to prevent the electrical feeding of the P&C unit 2 through the feeding port 21, when the operating temperature of the P&C device 1 is lower than a first threshold value TH1.

Further, the control device 3 is adapted to allow the electrical feeding of the P&C unit 2 through the feeding port 21 (obviously if the power supply means 60 are available to supply electric power), when the operating temperature of the P&C device 1 is higher than the threshold value TH1.

For the sake of clarity, it is specified that the definition "operating temperature of the P&C device" intends the temperature in a point of the internal volume defined by the enclosure 1A of the P&C device 1, e.g. in the vicinity of the P&C unit 2 or internally to this latter.

The threshold value TH1 is indicative of a minimum operating temperature provided for the P&C unit 2.

Preferably, such minimum operating temperature coincides with the rated minimum operating temperature (e.g. $-40°$ C.) for which the P&C unit 2 is designed (normally indicated in the fabrication datasheets).

According to some embodiments of the invention, the minimum operating temperature provided for the P&C unit 2 may be higher than the rated minimum operating temperature.

As an example, such a minimum operating temperature may be a temperature (e.g. $-35°$ C.) slightly higher than the rated minimum operating temperature to ensure a safety margin in the operation of the P&C unit 2.

The threshold value TH1 may be easily set according to the needs during the configuration of the control device 3.

Basically, the control device 3 has the function of preventing the operation of the control and power unit 2 if the operating temperature of the P&C device 1 is too low and the P&C unit 2 cannot work within its nominal operating range.

The control device 3 enables the P&C unit 2 to operate only when the conditions (i.e. operating temperature higher than the threshold value TH1) for a correct operation are present or restored (e.g. by heating the internal volume of the P&C device 1).

In this way, faults and malfunctions of the P&C unit 2 due to excessively low internal temperatures of the P&C device 1 are avoided.

As it is apparent from the above, it is important that the control device 3 correctly intervenes when critical operating temperatures are present.

To this aim, the control device 3 is preferably realized with military-standard electronic components.

Preferably, the control device 3 comprises a first thermostat, which in operation is electrically connected in a suitable manner (e.g. according to an electrical connection of the series type) to one or both the terminals of the feeding port 21 and the power supply means 60.

The thermostat 3 is configured to detect the internal temperature of the P&C device 1, e.g. in proximity of the power supply unit 2.

The thermostat 3 is configured to switch between an ON (conduction) state and an OFF (interdiction) state as a function of the detected temperature.

In particular, the thermostat 3 is configured to:
switch in an OFF state, thereby interrupting the circulation of current between the power supply means 60 and the P&C unit 2, when the operating temperature of the P&C device 1 is lower than the threshold value TH1;
switch in an ON state, thereby allowing the circulation of current between the power supply means 60 and the P&C unit 2, when the operating temperature of the P&C device 1 is higher than or equal to the threshold value TH1.

The thermostat 3 is preferably of the electronic type and it is advantageously supplied by an internal battery.

According to an aspect of the invention, the P&C unit 2 may be configured to receive electric power from electric energy storage means 10 that may be of known type.

The storage means 10 may comprise one or more batteries or capacitor banks.

Figure 3:
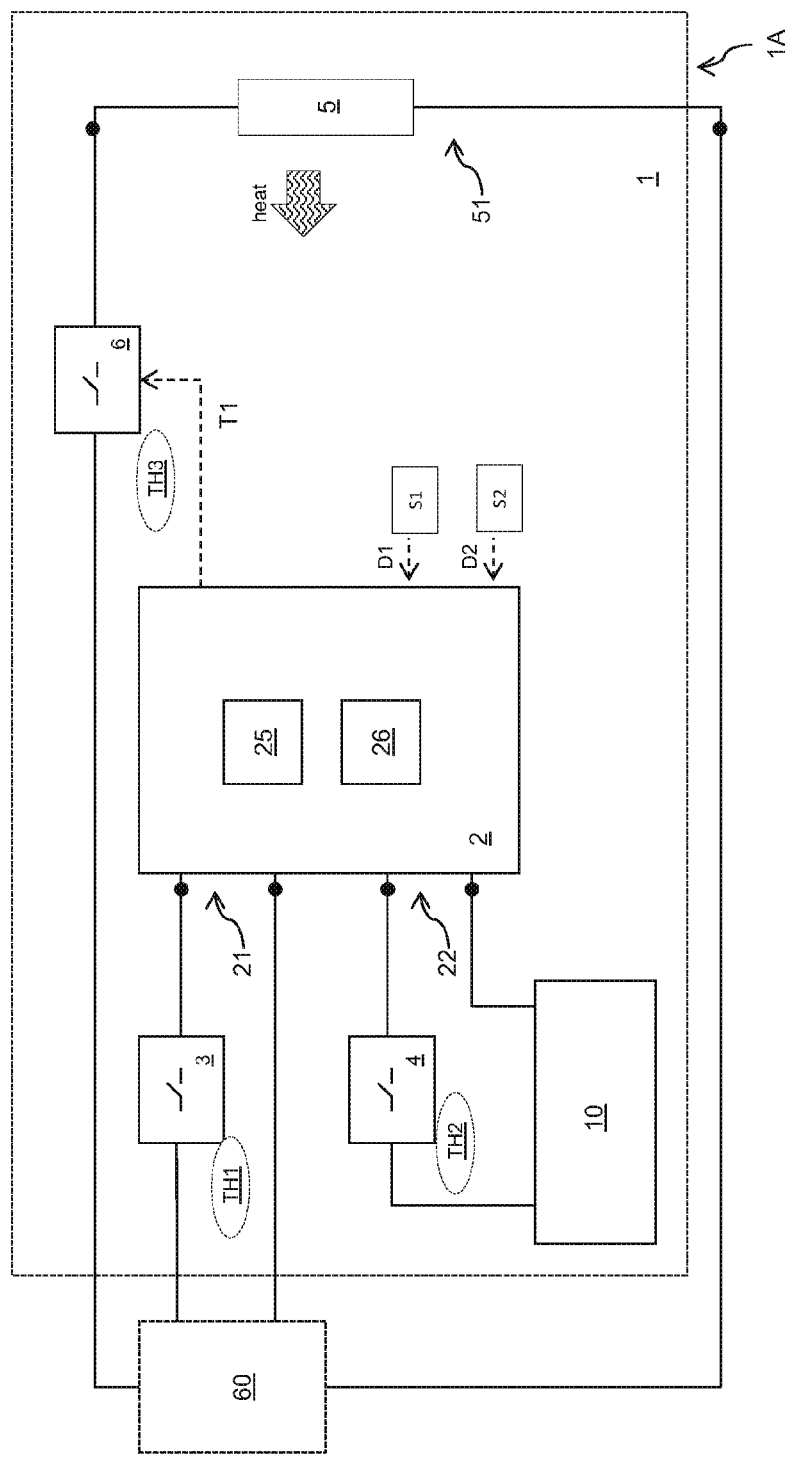
FIG. 3 is a block schematic diagram of another embodiment of the power and control device, according to present invention.
Figure 5:
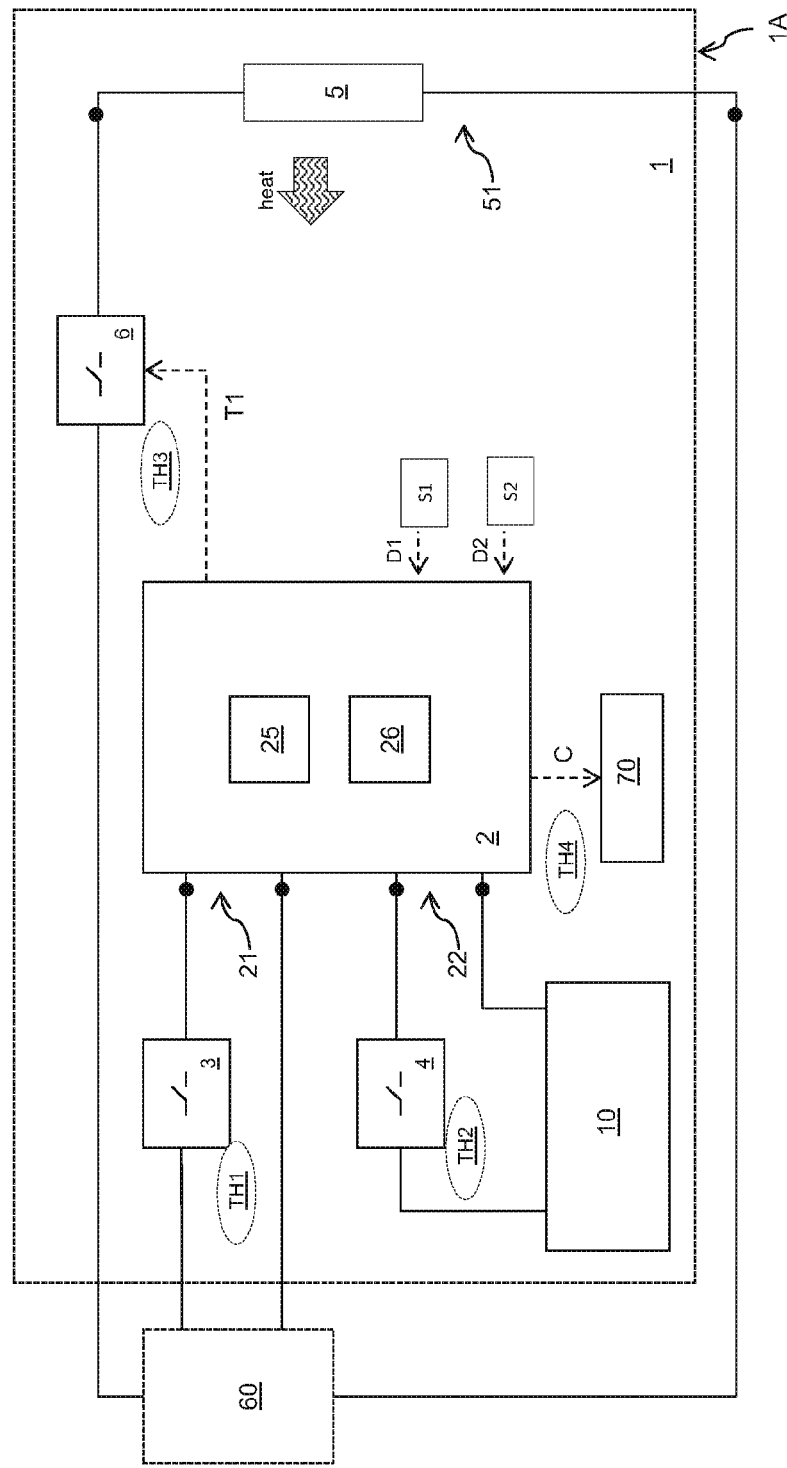
FIG. 5 is a block schematic diagram of another embodiment of the power and control device, according to present invention.
Figure 7:
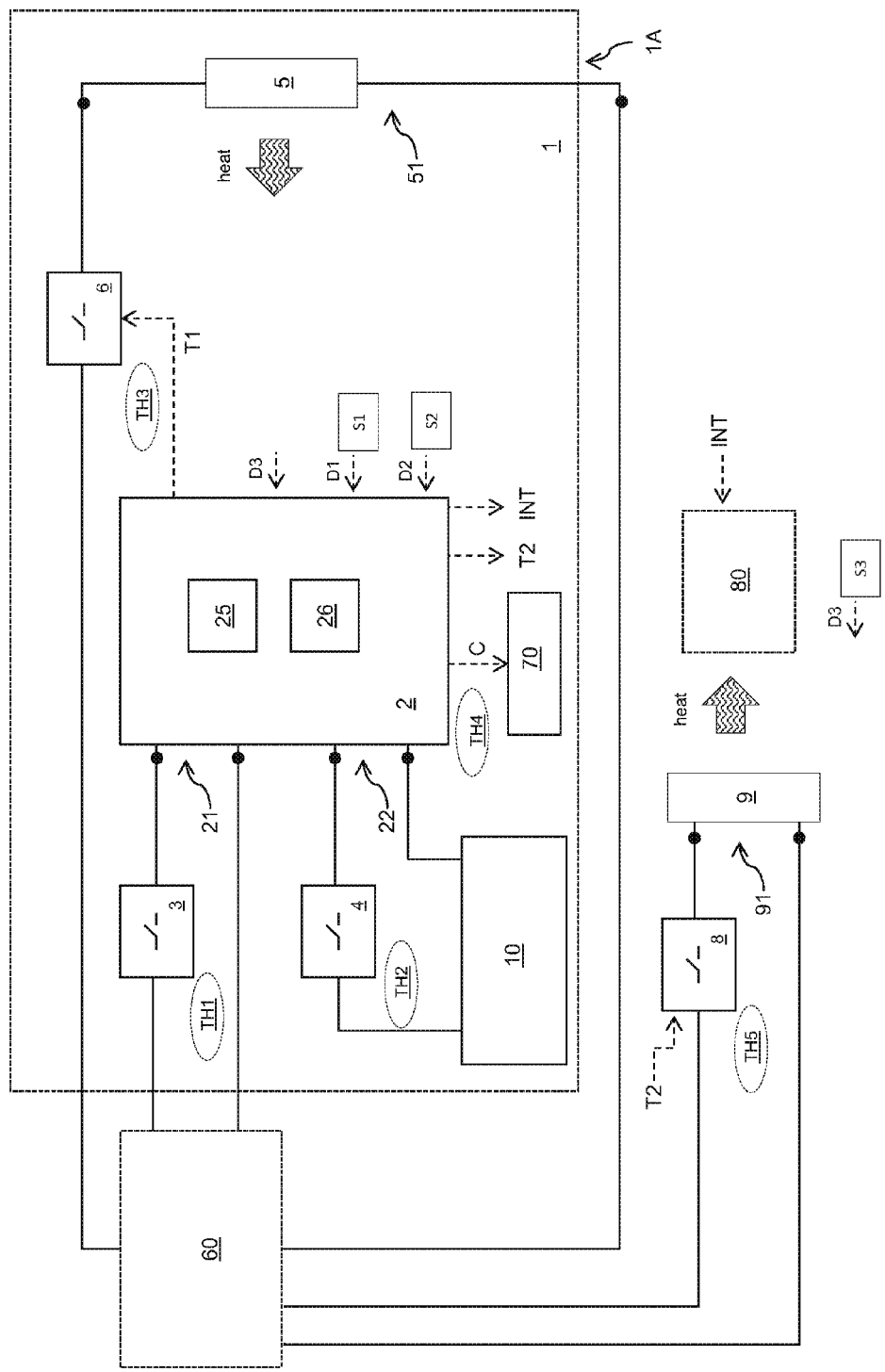
FIG. 7 is a block schematic diagram of another embodiment of the power and control device, according to present invention.

The storage means 10 are preferably comprised in the P&C device 1, as shown in FIGS. 3, 5, 7.

Figure 4:
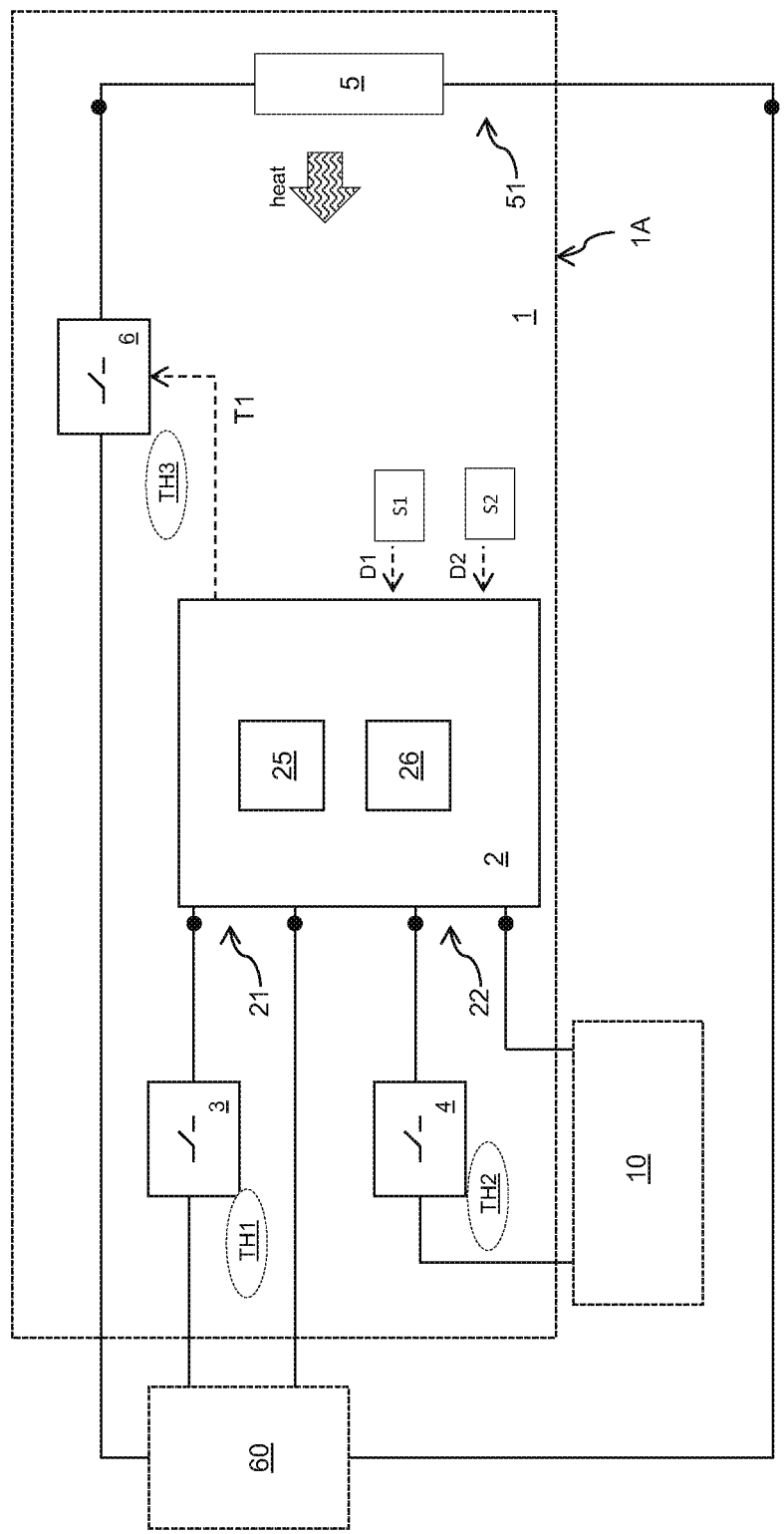
FIG. 4 is a block schematic diagram of another embodiment of the power and control device, according to present invention.
Figure 6:
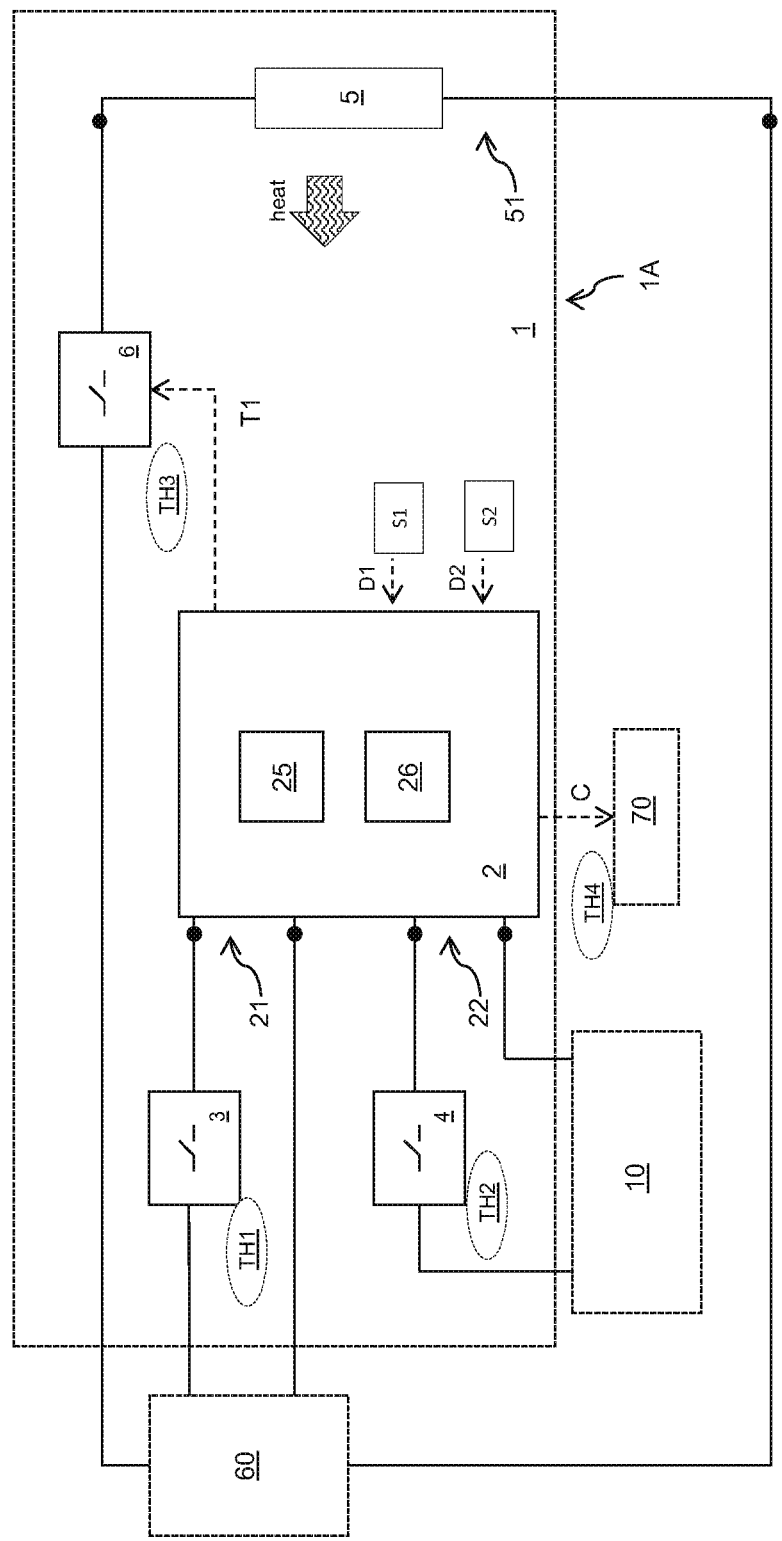
FIG. 6 is a block schematic diagram of another embodiment of the power and control device, according to present invention.

However, according to some embodiments of the invention, the storage means 10 may be external to the P&C device 1 (FIGS. 4, 6). In this case, they are preferably positioned in proximity of the P&C device 1.

The P&C unit 2 is provided with a second feeding port 22 electrically coupleable with the storage means 10.

According to an aspect of the invention, the P&C device 1 comprises a second control device 4, which in operation is electrically connected with the second feeding port 22 and the storage means 10.

The control device 4 is adapted to electrically couple/decouple the feeding port 22 to/from the storage means 10 as a function of the operating temperature of the P&C device 1.

More particularly, the control device 4 is adapted to prevent the electrical feeding of the P&C unit 2 through the feeding port 22, when the operating temperature of the P&C device 1 is lower than a second threshold value TH2.

The control device 4 is adapted to allow the electrical feeding of the P&C unit 2 through the feeding port 22 (obviously if the storage means 10 are available to supply electric power), when the operating temperature of the P&C device 1 is higher than the threshold value TH2.

The threshold value TH2 is indicative of the maximum temperature between a minimum operating temperature provided for the P&C unit 2 and a minimum operating temperature provided for the storage means 10.

As explained above, said minimum operating temperatures preferably coincide with the rated minimum operating temperatures for which the power supply unit 2 and the storage means 10 are designed.

However, according to some embodiments of the invention, said minimum operating temperatures may be higher than the minimum operating temperatures rated for the P&C unit 2 and the storage means 10.

The threshold value TH2 may be easily set according to the needs during the installation of the control device 4.

Basically, the control device 4 has the function of preventing the operation of the P&C unit 2 if the internal temperature of the P&C device 1 is too low and the P&C unit 2 cannot work in its normal temperature range.

As it electrically decouples the P&C unit 2 from the storage means 10, the control device 4 has also the function of preventing the operation of the storage means 10 if the internal temperature of the P&C device 1 is too low and the storage means 10 cannot work in their normal temperature range.

The control device 2 enables the P&C unit 2 and the storage means 10 to operate only when the conditions for a correct operation are present or restored (e.g. by heating the internal volume of the P&C device 1).

In this way, faults and malfunctions to the P&C unit 2 and the storage means 10 due to excessively low operating temperatures of the P&C device 1 are avoided.

Also the control device 4 is preferably realized with military-standard electronic components.

Preferably, the control device 4 comprises a second thermostat, which in operation is electrically connected in a suitable manner (e.g. according to an electrical connection of the series type) to one or both the terminals of the feeding port 22 and to the storage means 10.

The thermostat 4 is configured to detect the internal temperature of the P&C device 1, e.g. in proximity of the power supply unit 2.

The thermostat 4 is configured to switch between an ON (conduction) state and an OFF (interdiction) state as a function of the detected temperature.

In particular, the thermostat 4 is configured to:
switch in an OFF state, thereby interrupting the circulation of current between the storage means 10 and the P&C unit 2, when the operating temperature of the P&C device 1 is lower than the threshold value TH2;
switch in an ON state, thereby allowing the circulation of current between the storage means 10 and the P&C unit 2, when the operating temperature of the P&C device 1 is higher than or equal to the threshold value TH2.

The thermostat 4 is preferably of the electronic type and it is advantageously supplied by an internal battery.

According to an aspect of the invention, a first heating unit 5 is arranged to provide heat to the P&C device 1.

The heating unit 5 is preferably comprised in the P&C device 1, as shown in FIGS. 1, 3-7.

Figure 2:
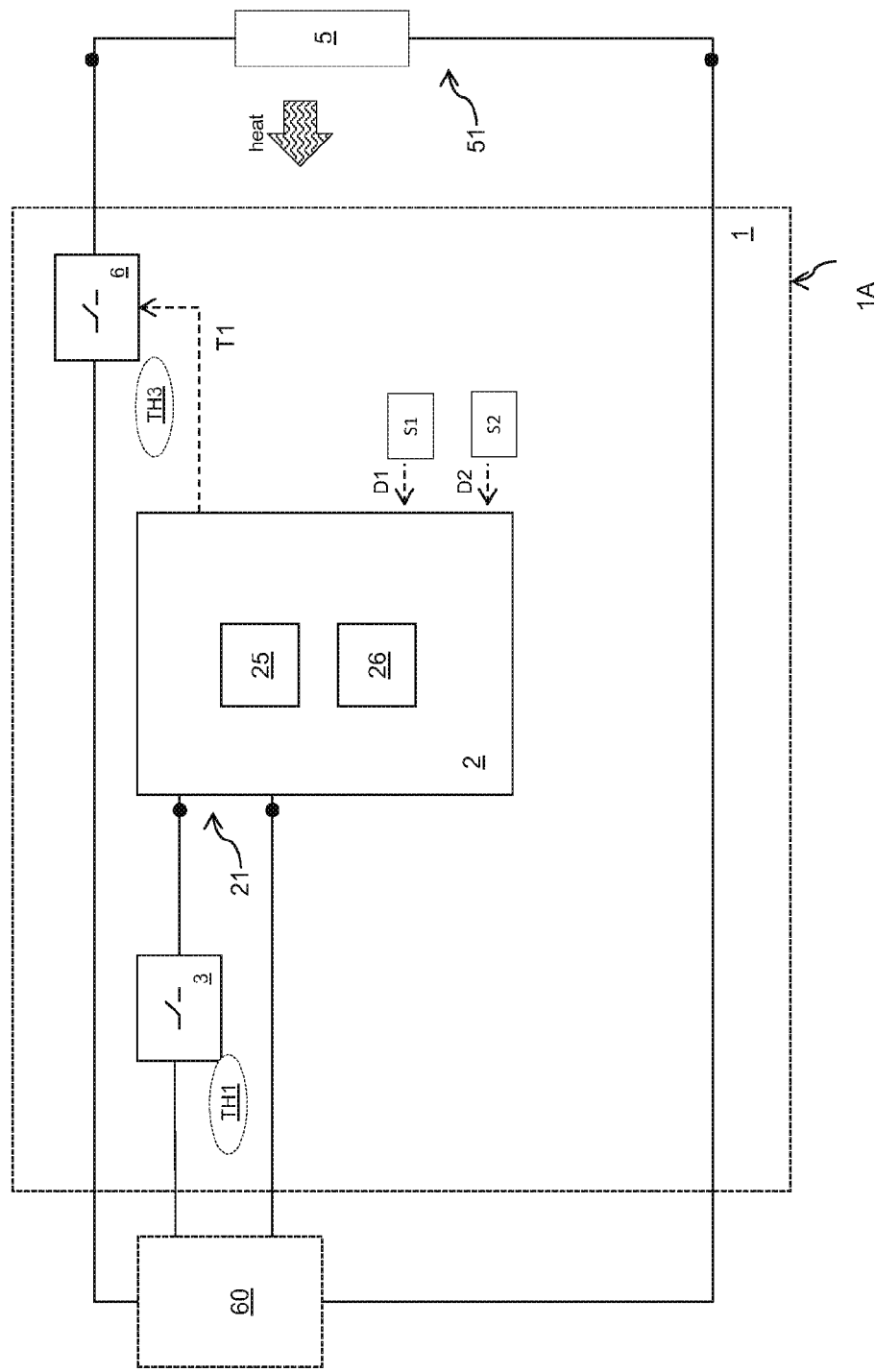
FIG. 2 is a block schematic diagram of another embodiment of the power and control device, according to present invention.

However, according to some embodiments of the invention, the heating unit 5 may be external to the P&C device 1 (FIG. 2). In this case, it is preferably positioned in proximity of the enclosure 1A.

Preferably, the heating unit 5 is electrically fed and comprises one or more electric heaters.

Preferably, the heating unit 5 is fed by the power supply means 60, as shown in the cited figures.

The heating unit 5 is provided with a third feeding port 51 electrically coupleable with the power supply means 60.

According to an aspect of the invention, the P&C device 1 comprises a third control device 6, which in operation is electrically connected with the feeding port 51 of the heating unit 5 and the power supply means 60.

The control device 6 is adapted to electrically couple/decouple the feeding port 51 to/from the power supply means 60 as a function of the temperature of the P&C device 1.

More particularly, the control device 6 is adapted to prevent the electrical feeding of the heating unit 5 through the feeding port 51, when the operating temperature of the P&C device 1 is higher than a third threshold value TH3.

The control device 6 is adapted to allow the electrical feeding of the heating unit 5 through the feeding port 51 (obviously if the power supply means 60 are available to supply electric power), when the operating temperature of the P&C device 1 is lower than the threshold value TH3.

The threshold value TH3 is indicative of a nominal operating temperature provided for the P&C unit 2.

Preferably, such nominal operating temperature coincides with the rated nominal operating temperature (e.g. 25° C.) for which the power supply unit 2 and the internal electronic components thereof are designed.

According to some embodiments of the invention, such nominal operating temperature may be different than the rated nominal operating temperature.

As an example, said nominal operating temperature may vary depending on other environmental factors, such as, for example, the internal relative humidity of the P&C device 1.

Preferably, the control device 6 is controlled by the P&C unit 2, which is operatively coupled (for example by means of suitable electrical connections) with the control device 6.

In this case, the P&C unit 2 is configured to provide suitable control signals T1 to operate the control device 6, so that:

the control device 6 prevents the electrical feeding of the heating unit 5 through the feeding port 51, when the operating temperature of the P&C device 1 is higher than the threshold value TH3;

the control device 6 allows the electrical feeding of the heating unit 5 through the feeding port 51, when the operating temperature of the P&C device 1 is lower than the threshold value TH3.

The threshold value TH3 may be easily set by the P&C unit 2 according to the needs.

The control device 6 allows avoiding faults and accelerated ageing of components of the P&C unit 2 due to over-heating phenomena.

Preferably, the P&C device 1 comprises first sensing means S1 adapted to provide first sensing signals D1 indicative of the operating temperature of the P&C device.

The sensing means S1 may comprise a temperature sensor of known type.

The sensing means S1 may be included in the P&C unit 2.

As an alternative, they may be positioned in proximity of the P&C unit 2 and operatively coupled with this latter (e.g. through suitable electrical connections).

Preferably, the P&C unit 2 is configured to control the operation of the control device 6 on the base of the information provided by the sensing signals D1.

Preferably, the P&C unit 2 is configured to execute a control procedure that comprises the following steps:

acquiring the sensing signals D1;

comparing the temperature data provided by the sensing signals D1 with the threshold value TH3;

generating suitable control signals T1 to operate the control device 6, so that the control device 6 prevents the electrical feeding of the heating unit 5 through the feeding port 51, when the operating temperature of the P&C device 1 is higher than the threshold value TH3.

From the above, it is apparent how the sensing means S1, in conjunction with the P&C unit 2, form a control loop that allows controlling the operation of the control device 6 as a function of the operating temperature of the P&C device 1.

Such a control loop provides a reliable control of the operating temperature of the P&C device 1 in order to avoid over-heating phenomena.

Preferably, the P&C device 1 comprises second sensing means S2 adapted to provide second sensing signals D2 indicative of the internal relative humidity of the P&C device.

The second sensing means S2 may comprise a relative humidity sensor of known type.

The sensing means S2 may be included in the P&C unit 2.

As an alternative, they may be positioned in the proximity of the P&C unit 2 and operatively coupled with this latter (e.g. through suitable electrical connections).

Preferably, the P&C unit 2 is configured to control the operation of the control device 6 on the base of the information provided by the sensing signals D2.

In particular, the P&C unit 2 is configured to set the threshold value TH3 on the base of the information provided by the sensing signals D2.

Preferably, the P&C unit 2 is configured to execute a control procedure that comprises the following steps:

acquiring the sensing signals D2;

calculating a dew point temperature value on the base of the relative humidity data provided by the sensing signals D2;

setting the threshold value TH3 on the base of the calculated dew point temperature value;

acquiring the sensing signals D1;

comparing the detected temperature values provided by the sensing signals D1 with the set threshold value TH3;

generating suitable control signals T1 to operate the control device 6, so that the control device 6 prevents the electrical feeding of the heating unit 5 through the feeding port 51, when the operating temperature of the P&C device 1 is higher than the threshold value TH3.

From the above, it is apparent how the sensing means S2, in conjunction with the P&C unit 2, form a control loop that allows adjusting the threshold value TH3 as a function of the internal humidity of the P&C device 1.

Such a control loop operates concurrently with respect to the control loop including the sensing means S1 described above.

This solution allows maintaining the operating temperature of the P&C device 1 low when the internal humidity is relatively low and progressively increasing the operating temperature when the relative humidity increases.

The useful life of the electronic components of the P&C unit 2 can thus be prolonged when the internal humidity is relatively low.

On the other hand, it is possible to avoid water condensation phenomena when the internal humidity is relatively high.

Also the control device 6 is preferably realized with military-standard electronic components.

Preferably, the control device 6 comprises a a first relay of the normally-closed (NC) type.

As it is of the NC-type, the relay 6 is configured to switch from an ON (conduction) state to an OFF (interdiction) state depending on whether it receives suitable tripping signals T1 from the P&C unit.

In particular, the relay 6 is configured to:

stay in an ON state, thereby allowing the circulation of current between the power supply means 60 and the heating unit 5, when it receives no tripping signals T1 from the P&C unit 2;

switch in an OFF state, thereby interrupting the circulation of current between the power supply means 60 and the heating unit 5, when it receives tripping signals T1 from the P&C unit 2.

As it is of the NC-type, the relay 6 maintains the mentioned ON state even when the P&C unit 2 is switched-off.

This means that the heating unit 5 is enabled to provide heat to the P&C device 1 independently from the operative status of the P&C unit 2.

This feature is particularly important when the power supply means 60 are restored after a failure. In this case, in fact, the heating unit 5 can start immediately operating even if the power and supply unit 2 is still switched-off, e.g. due to the intervention of the control devices 2 and/or 4 described above.

According to an aspect of the invention, the P&C unit 2 is adapted to drive one or more electronic devices 70, such as, for example, a LCD display, additional batteries or the like.

The electronic devices 70 are preferably comprised in the P&C device 1, as shown in FIGS. 5, 7.

However, according to some embodiments of the invention, the electronic devices 70 may be external to the P&C device 1 (FIG. 6). In this case, they are preferably positioned in proximity of the power and supply device 1.

The P&C unit 2 is configured to deactivate the electronic devices 70, when the operating temperature of the P&C unit 2 is lower than one or more corresponding fourth threshold values TH4.

The threshold values TH4 are indicative of corresponding minimum operating temperatures provided for the electronic devices 70.

Preferably, said minimum operating temperatures coincide with the rated minimum operating temperatures (e.g. −40° C.) for which the electronic devices 70 are designed.

According to some embodiments of the invention, said minimum operating temperatures may be higher than the minimum operating temperatures rated for the electronic devices 70.

For each electronic device 70, a threshold value TH4 may be easily set by the P&C unit 2 according to the needs.

Preferably, the P&C unit 2 is configured to control the operation of the electronic devices 70 on the base of the information provided by the sensing signals D1 provided by the sensing means S1.

Preferably, the P&C unit 2 is configured to execute a control procedure that comprises the following steps:
  acquiring the sensing signals D1;
  comparing the temperature data provided by the sensing signals D1 with the maximum value of said threshold values TH4, each threshold value TH4 corresponding to an electronic device 70;
  deactivating said electronic devices 70, when the operating temperature of the P&C device 1 is lower than the maximum value of said threshold values TH4.

The deactivation of the electronic devices 70 may be obtained by generating suitable control signals C or by stopping the electrical feeding of said electronic devices, when the latters are directly fed by the P&C unit 2.

From the above, it is evident that the P&C unit 2 operates, in this case, as a control device having the function of preventing the operation of electronic devices 70 if the operating temperature is too low and said devices cannot work within their normal temperature ranges.

The sensing means S1, in conjunction with the P&C unit 2, form a control loop that allows controlling the operation of the electronic devices 70 as a function of the operating temperature of the P&C device, which is supposed (with a negligible error) to be as corresponding to their operating temperature.

According to an aspect of the invention, the P&C device 1 may be arranged to control the operating temperature of at least an external appliance 80, which may be in a remote position.

The appliance 80 may be of electromagnetic, electric, or electronic type.

As an example, in a MV switching device, the appliance 80 may be the power equipment (e.g.
  an electromagnetic actuator) accommodated in the high voltage cabinet of the switching device.

Preferably, a second heating unit 9 is arranged to provide heat to the appliance 80.

Preferably, the heating unit 9 is electrically fed and comprises one or more electric heaters.

As an example, in a MV switching device, the heating unit 9 may comprise an electric heater positioned in the high voltage cabinet of the switching device.

Preferably, the heating unit 9 is fed by the power supply means 60, as shown in the cited figures.

The heating unit 9 is provided with a fourth feeding port 91 electrically coupleable with the power supply means 60.

Preferably, the P&C device 1 comprises a fourth control device 8, which in operation is electrically connected with the feeding port 91 and the power supply means 60.

The control device 8 is adapted to electrically couple/decouple the feeding port 91 to/from the power supply means 60 as a function of the operating temperature of the appliance 80.

More particularly, the control device 8 is adapted to prevent the electrical feeding of the heating unit 9 through the feeding port 91, when the temperature at the appliance 80 is higher than a fifth threshold value TH5.

The control device 8 is adapted to allow the electrical feeding of the heating unit 9 through the feeding port 91 (obviously if the power supply means 60 are available to supply electric power), when the operating temperature of the appliance 80 is lower than the threshold value TH5.

The threshold value TH5 is indicative of a nominal operating temperature provided for the appliance 80.

Preferably, such nominal operating temperature coincides with the rated nominal operating temperature (e.g. 25° C.) for which the appliance 80 is designed.

According to some embodiments of the invention, such nominal operating temperature may be different than the rated nominal operating temperature.

As an example, said nominal operating temperature may vary depending on other environmental factors, such as, for example, the operating relative humidity of the appliance 80.

Preferably, the control device 8 is controlled by the P&C unit 2, which is operatively coupled (for example by means of suitable electrical connections) with the control device 8.

In this case, the P&C unit 2 is configured to provide suitable control signals T2 to operate the control device 8, so that:
  the control device 8 prevents the electrical feeding of the heating unit 9 through the feeding port 91, when the operating temperature of the appliance 80 is higher than the threshold value TH5;
  the control device 8 allows the electrical feeding of the heating unit 9 through the feeding port 91, when the operating temperature of the appliance 80 is lower than the threshold value TH5.

The threshold value TH5 may be easily set by the P&C unit 2 according to the needs.

The control device 8 allows avoiding faults and accelerated ageing of components of the appliance 80 due to over-heating phenomena.

Preferably, the P&C device 1 comprises third sensing means S3 adapted to provide third sensing signals D3 indicative of the temperature of the appliance 80.

The sensing means S3 may comprise a temperature sensor of known type.

The sensing means S3 may be mounted on the appliance 80 or are positioned in the proximity thereof.

The sensing means S3 are operatively coupled with the P&C unit 2 (e.g. through suitable electrical connections).

Preferably, the P&C unit 2 is configured to control the operation of the control device 8 on the base of the information provided by the sensing signals D3.

Preferably, the P&C unit 2 is configured to execute a control procedure that comprises the following steps:
  acquiring the sensing signals D3;
  comparing the temperature data provided by the sensing signals D3 with the threshold value TH5;
  generating suitable control signals T2 to operate the control device 8, so that the control device 8 prevents the electrical feeding of the heating unit 9 through the feeding port 91, when the temperature of the appliance 80 is higher than the threshold value TH5.

Preferably, the control device 8 comprises a second relay of the normally-closed (NC) type. As it is of the NC-type, the relay 8 is configured to switch from an ON (conduction) state to an OFF (interdiction) state depending on whether it receives suitable tripping signals T2 from the P&C unit.

In particular, the relay 8 is configured to:

stay in an ON state, thereby allowing the circulation of current between the power supply means 60 and the heating unit 9, when it receives no tripping signals T2 from the P&C unit 2;

switch in an OFF state, thereby interrupting the circulation of current between the power supply means 60 and heating unit 9, when it receives tripping signals T2 from the P&C unit 2.

As it is of the NC-type, the relay 8 maintains the mentioned ON state even when the P&C unit 2 is switched-off.

This means that the heating unit 9 is enabled to provide heat to the appliance 80 independently from the operative status of the P&C unit 2.

This feature is particularly important when the power supply means 60 are restored after a failure.

In this case, in fact, the heating unit 9 can start immediately operating even if the power and supply unit 2 is still switched-off, e.g. due to the intervention of the control devices 2 and/or 4 described above.

Preferably, the P&C unit 2 is configured to operate as a control device having the function of preventing the operation of appliance 80 if the operating temperature is too low and the appliance 80 cannot work within its nominal operating range.

In particular, the P&C unit 2 is configured to deactivate the appliance 80, when the operating temperature of said appliance is lower than a sixth threshold value TH6.

The threshold value TH6 is indicative of minimum operating temperature provided for the appliance 80.

Preferably, said minimum operating temperature coincides with the rated minimum operating temperature (e.g. −40° C.) for which the appliance 80 is designed.

According to some embodiments of the invention, said minimum operating temperature may be higher than the minimum operating temperature rated for the appliance 80.

The threshold value TH6 may be easily set by the P&C unit 2 according to the needs.

Preferably, the P&C unit 2 is configured to execute a control procedure that comprises the following steps:

acquiring the sensing signals D3;

comparing the temperature data provided by the sensing signals D3 with the threshold value TH6;

deactivating the appliance 80, when the operating temperature of the appliance 80 is lower than said threshold value TH6.

The deactivation of the electronic devices 70 may be obtained by generating suitable interlocking signals INT (or other control signals of different type) or by stopping the electrical feeding of the appliance 80, when this latter is directly fed by the P&C unit 2.

From the above, it is apparent how the sensing means S3, in conjunction with the P&C unit 2, form a control loop that allows controlling the operation of the control device 6 as a function of the operating temperature of the appliance 80.

Such a control loop avoid over-heating phenomena and enables the operation of the appliance 80 only when operating temperatures are within the normal range of this latter.

According to a possible embodiment of the invention, when the appliance 80 is the electromagnetic actuator of a MV switching device, the P&C unit 2 may execute methods for determining the operating status of the MV switching device in order to acquire information related to the operating temperature of the appliance 80.

As an example, the P&C unit 2 may execute a method for determining the operating status of a MV switching device as the one described in the patent application no. EP 14185581.7.

In these cases, the adoption of the sensing means D3 is not necessary anymore.

An example of operation of the P&C device 1 is here described in more details.

The power supply means 60 and the electric energy storage means 10 are supposed to be available to provide electric power to the P&C unit 2.

The power supply means 60 are supposed to have been restored after a prolonged period of interruption.

The temperature of the P&C device 1 is initially assumed to be lower than the threshold values TH1, TH2, with TH2>TH1.

As the temperature is lower than the threshold values TH1 and TH2, the thermostats 3, 4 prevent that the P&C unit 2 is electrically fed.

In this situation, both the P&C unit 2 and the storage means 10 cannot operate and are protected from faults due to excessively low temperatures.

On the other hand, as the power supply means 60 are available and the temperature is lower than the threshold value TH3, the relay 6 allows the heating unit 5 to provide heat even if it cannot communicate with the P&C unit 2 that is still switched-off.

The temperature of the P&C device progressively increases.

When the temperature overcomes the threshold value TH1, the P&C unit 2 is powered by the power supply means 60, as the thermostat 3 enables the P&C unit 2 to receive electric power at the feeding port 21.

The temperature of the P&C device 1 is still lower than the threshold value TH2.

In this situation, the storage means 10 cannot yet operate due to the action of the thermostat 4.

On the other hand, the P&C unit 2 can operate even if there is no back-up power supply available yet.

The temperature of the P&C device continues to progressively increase.

When the temperature overcomes the threshold value TH2, the P&C unit 2 can be powered also by the storage means 10, as the thermostat 4 enables the P&C unit 2 to receive electric power at the feeding port 22.

The P&C unit 2 can now operate in safe conditions also from the electrical feeding point of view (there is a back-up power supply available now).

It is observed that the P&C unit can fully operate with a time delay with respect to the instant in which a power supply is actually made available.

Such a delay (which normally is quite small, typically in the order of some minutes) basically depends on the environmental temperature, on the thermal characteristics of the P&C device 1 and on the nominal power of the heating unit 5.

The temperature of the P&C device 1 continues to progressively increase.

The heating unit 5 is now commanded by the control loops comprising the P&C unit 2 and the sensing means S1, S2.

In this way, the operating temperature of the P&C device 1 is controlled and over-heating phenomena are avoided.

The P&C device 1, according to the present invention, provides remarkable advantages with respect to the solutions of the state of the art.

The P&C device 1 provides reliable and improved performances even when operating at very low temperatures (e.g. at temperatures around −40° C. or lower).

Thanks to the embedded control device 3 (and possibly 4) the operation of the P&C unit 2 is managed in a safe manner when cold-start conditions occur, thereby avoiding damages due to excessively low temperatures.

In addition, thanks to the embedded control device 6, the operating temperature of the P&C devices 1 is constantly controlled the P&C unit 2 is active, thereby avoiding over-heating phenomena.

The P&C device 1 allows safely managing the operation of possible storage means 10, electronic devices 70 and/or external appliances 80, which are operatively associated thereto, as a function of their actual operating temperature.

The P&C device 1 is particularly suitable for use in MV electric applications (e.g. in MV switching apparatuses) for outdoor installations.

The P&C device 1 is easy and cheap to manufacture at industrial levels with respect to the solutions currently available in the state of the art.

The invention claimed is:

1. A power and control device for medium voltage applications, which comprises:
   a power and control unit having a first feeding port electrically coupleable with electric power supply means;
   a first controller, which in operation is electrically connected to said first feeding port and said power supply means, said first controller being configured to prevent the electrical feeding of said power and control unit through said first feeding port, in response to the operating temperature of said power and control device being lower than a first threshold value (TH1) indicative of a minimum operating temperature provided for said power and control unit; and
   a second controller, which in operation is electrically connected to a second feeding port and an electric energy storage means, said second controller being configured to prevent the electrical feeding of said power and control unit through said first feeding port, in response to the operating temperature of said power and control device being lower than a second threshold value (TH2) indicative of the minimum operating temperature provided for said electric energy storage means;
   wherein TH1 is different from TH2.

2. A power and control device, according to claim 1, wherein said first controller comprises a first thermostat.

3. A power and control device, according to claim 1, wherein said second controller comprise a second thermostat.

4. A power and control device, according to claim 1 which comprises a third controller controlled by said power and control unit, said third controller being in operation electrically connected to said power supply means and to a third feeding port of a first heating unit adapted to provide heat to said power and control device, said third controller being adapted to prevent the electrical feeding of said first heating unit through said third feeding port, when the operating temperature of said power and control device is higher than a third threshold value (TH3) indicative of a nominal operating temperature provided for said power and control unit.

5. A power and control device, according to claim 4, which comprises first sensing means adapted to provide first sensing signals (D1) indicative of the temperature of said power and control device, said power and control unit being configured to control the operation of said third controller on the base of the information provided by said first sensing signals.

6. A power and control device, according to claim 4 which comprises second sensing means adapted to provide second sensing signals (D2) indicative of the internal relative humidity of said power and control device, said power and control unit being configured to set said third threshold value (TH3) on the base of the information provided by said second sensing signals.

7. A power and control device, according to claim 4, wherein said third control device comprises a first relay of the NC type.

8. A power and control device, according to claim 4, wherein said power and control unit is adapted to drive one or more electronic devices, said power and control unit being configured to deactivate said electronic devices via control signals, when the operating temperature of said power and control device is lower than one or more corresponding fourth threshold values (TH4) indicative of corresponding minimum operating temperatures provided for said electronic devices.

9. A power and control device, according to-claim 1 which comprises a fourth controller controlled by said power and control unit, said fourth controller being in operation electrically connected to said power supply means and to a fourth feeding port of a second heating unit adapted to provide heat to at least an external appliance, said fourth controller being adapted to prevent the electrical feeding of said second heating unit through said fourth feeding port, when the operating temperature of said external appliance is respectively higher than a fifth threshold value (TH5) indicative of a nominal operating temperature provided for said external appliance.

10. A power and control device, according to claim 9, wherein it comprises third sensing means adapted to provide third sensing signals (D3) indicative of the operating temperature of said external appliance, said power and control unit being configured to control the operation of said fourth controller on the base of the information provided by said third sensing signals.

11. A power and control device, according to claim 10, wherein said fourth controller comprises a second relay of the NC type.

12. A power and control device, according claim 9, wherein said power and control unit is configured to cause deactivation of said appliance, when the operating temperature of said power and control device is respectively lower than a sixth threshold value indicative of a minimum operating temperature provided for said external appliance.

13. A MV switching apparatus which comprises a power and control device, according to claim 1.

14. A power and control device, according to claim 2 which comprises a third controller controlled by said power and control unit, said third controller being in operation electrically connected to said power supply means and to a third feeding port of a first heating unit adapted to provide heat to said power and control device, said third controller being adapted to prevent the electrical feeding of said first heating unit through said third feeding port, when the operating temperature of said power and control device is higher than a third threshold value (TH3) indicative of a nominal operating temperature provided for said power and control unit.

* * * * *